US012431079B2

(12) United States Patent
Yuan et al.

(10) Patent No.: US 12,431,079 B2
(45) Date of Patent: Sep. 30, 2025

(54) DISPLAY SUBSTRATE AND DISPLAY DEVICE

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/767,757

(22) PCT Filed: May 13, 2021

(86) PCT No.: PCT/CN2021/093529
§ 371 (c)(1),
(2) Date: Apr. 8, 2022

(87) PCT Pub. No.: WO2021/249101
PCT Pub. Date: Dec. 16, 2021

(65) Prior Publication Data
US 2024/0087516 A1 Mar. 14, 2024

(30) Foreign Application Priority Data

Jun. 12, 2020 (CN) .......................... 202010536702.7

(51) Int. Cl.
G09G 3/3233 (2016.01)
G09G 3/3266 (2016.01)
H10K 59/131 (2023.01)

(52) U.S. Cl.
CPC ......... G09G 3/3233 (2013.01); G09G 3/3266 (2013.01); H10K 59/131 (2023.02);
(Continued)

(58) Field of Classification Search
CPC ............... G09G 3/3233; G09G 3/3266; G09G 2310/061; G09G 2320/0204; H10K 59/131

See application file for complete search history.

(56) References Cited

U.S. PATENT DOCUMENTS 11,308,864 B1* 4/2022 Liao .......................... G09G 3/32
2006/0044245 A1* 3/2006 Park ..................... G09G 3/3291
345/92

(Continued)

FOREIGN PATENT DOCUMENTS

CN 104123912 A 10/2014
CN 104715726 A 6/2015

(Continued)

OTHER PUBLICATIONS

CN202010536702.7 first office action.

Primary Examiner — Benjamin C Lee
(74) Attorney, Agent, or Firm — IPro, PLLC

(57) ABSTRACT

Provided is a display substrate, including: a base substrate; a plurality of sub-pixels arranged in an array on the base substrate, each of the sub-pixels including a light-emitting drive circuit, a reset circuit, a compensation circuit and a light-emitting element; wherein the light-emitting drive circuit and the reset circuit are connected to the light-emitting element, the light-emitting drive circuit is configured to provide a drive signal to the light-emitting element, and the reset circuit is configured to provide a reset signal to the light-emitting element; the compensation circuit is connected to the light-emitting drive circuit, and the compensation circuit is configured to provide a compensation signal to the light-emitting drive circuit; wherein at least two of the sub-pixels share a same target circuit, and the target circuit includes at least one of the reset circuit and the compensation circuit.

18 Claims, 14 Drawing Sheets

(52) U.S. Cl.
CPC ............... *G09G 2310/061* (2013.01); *G09G 2320/0204* (2013.01)

(56) References Cited

U.S. PATENT DOCUMENTS

| | | | |
|---|---|---|---|
| 2015/0293546 A1* | 10/2015 | Tanaka | G02F 1/13454 |
| | | | 327/541 |
| 2016/0203761 A1 | 7/2016 | Zhang | |
| 2016/0284274 A1 | 9/2016 | Tan et al. | |
| 2017/0140707 A1 | 5/2017 | Xu et al. | |
| 2018/0005584 A1 | 1/2018 | Hyeon et al. | |
| 2018/0018916 A1 | 1/2018 | Chung | |
| 2018/0061318 A1 | 3/2018 | Yin et al. | |
| 2018/0137817 A1* | 5/2018 | Wu | G09G 3/3233 |
| 2018/0350286 A1* | 12/2018 | Lee | G09G 3/3225 |
| 2019/0005883 A1* | 1/2019 | Kim | G09G 3/3233 |
| 2019/0103060 A1* | 4/2019 | Kang | G09G 3/3266 |
| 2019/0259335 A1* | 8/2019 | Yang | G09G 3/3225 |
| 2019/0355301 A1* | 11/2019 | Lee | G09G 3/3275 |
| 2021/0319748 A1 | 10/2021 | Chen et al. | |

FOREIGN PATENT DOCUMENTS

| | | |
|---|---|---|
| CN | 105118442 A | 12/2015 |
| CN | 105609049 A | 5/2016 |
| CN | 106920510 A | 7/2017 |
| CN | 107103878 A | 8/2017 |
| CN | 107170408 A | 9/2017 |
| CN | 110379366 A | 10/2019 |
| CN | 111564140 A | 8/2020 |

\* cited by examiner

DISPLAY SUBSTRATE AND DISPLAY DEVICE

CROSS-REFERENCE TO RELATED APPLICATION

This application is a national phase application based on PCT/CN2021/093529, filed on May 13, 2021, which claims priority to Chinese Patent Application No. 202010536702.7, filed on Jun. 12, 2020 and entitled "DISPLAY SUBSTRATE AND DISPLAY APPARATUS", the disclosures of which are incorporated herein by reference in their entireties.

TECHNICAL FIELD

The present disclosure relates to the field of display technologies, particularly relates to a display substrate and a display device.

BACKGROUND

Organic light emitting diode (OLED) display substrates are widely used in the display field due to their advantages of self-luminescence, wide viewing angle fast response speed, and the like.

SUMMARY

The present disclosure provides a display substrate and a display device. The technical solutions are as follows.

In an aspect, a display substrate is provided. The display substrate includes:
a base substrate;
a plurality of sub-pixels arranged in an array on the base substrate, each of the sub-pixels includes a light-emitting drive circuit, a reset circuit, a compensation circuit and a light-emitting element; wherein the light-emitting drive circuit and the reset circuit are connected to the light-emitting element, the light-emitting drive circuit is configured to provide a drive signal to the light-emitting element, and the reset circuit is configured to provide a reset signal to the light-emitting element; the compensation circuit is connected to the light-emitting drive circuit, and the compensation circuit is configured to provide a compensation signal to the light-emitting drive circuit;
wherein at least two of the sub-pixels share a same target circuit, and the target circuit includes at least one of the reset circuit and the compensation circuit.

In some embodiments, the display substrate includes a plurality of pixels, wherein each of the pixels includes a plurality of sub-pixels; and the at least two of the sub-pixels sharing the same target circuit belong to the same pixel.

In some embodiments, the plurality of sub-pixels in each of the pixels share the same target circuit.

In some embodiments, the display substrate includes a plurality of pixels, wherein each of the pixels includes a plurality of sub-pixels; and the at least two of the sub-pixels sharing the same target circuit belong to different pixels.

In some embodiments, the at least two of the sub-pixels sharing the same target circuit are disposed in a same row.

In some embodiments, the at least two of the sub-pixels sharing the same target circuit are disposed in a same column.

In some embodiments, each of the sub-pixels further includes a light-emitting control circuit, the light-emitting control circuit being connected to the light-emitting drive circuit, and configured to provide a DC power supply signal to the light-emitting drive circuit;
wherein the target circuit includes at least one of the reset circuit, the compensation circuit, and the light-emitting control circuit.

In some embodiments, the target circuit includes the reset circuit, the compensation circuit, and the light-emitting control circuit.

In some embodiments, the display substrate further includes: a plurality of first gate lines, a plurality of second gate lines, a plurality of third gate lines, a plurality of data lines, and a first drive circuit; wherein
the first drive circuit is connected to each of the first gate lines, each of the second gate lines and each of the third gate lines, and the first drive circuit is configured to provide a first gate drive signal to each of the first gate lines, provide a second gate drive signal to each of the second gate lines, and provide a third gate drive signal to each of the third gate lines;
the light-emitting drive circuit is further connected to one of the first gate lines and one of the data lines, and the light-emitting drive circuit is configured to provide the drive signal to the light-emitting element in response to the first gate drive signal from the first gate line and a data signal from the data line,
the reset circuit is further connected to one of the second gate lines, and the reset circuit is configured to provide the reset signal to the light-emitting element in response to the second gate drive signal from the second gate line; and
the compensation circuit is further connected to one of the third gate lines, and the compensation circuit is configured to provide the compensation signal to the light-emitting drive circuit in response to the third gate drive signal from the third gate line.

In some embodiments, the base substrate is provided with a display region and a non-display region surrounding the display region;
wherein the plurality of sub-pixels and the first drive circuit are disposed in the display region.

In some embodiments, each of the sub-pixels further includes a light-emitting control circuit; and the display substrate further includes a plurality of light-emitting control signal lines and a second drive circuit, wherein
the second drive circuit is connected to each of the light-emitting control signal lines, and the second drive circuit is configured to provide a light-emitting control signal to each of the light-emitting control signal lines; and
the light-emitting control circuit is further connected to one of the light-emitting control signal lines, and the light-emitting control circuit is configured to provide the DC power supply signal to the light-emitting drive circuit in response to the light-emitting control signal from the light-emitting control signal line.

In some embodiments, the base substrate is provided with a display region and a non-display region surrounding the display region;
wherein the plurality of sub-pixels and the second drive circuit are disposed in the display region.

In some embodiments, the light-emitting drive circuit in each of the sub-pixels includes a data write sub-circuit, a drive sub-circuit and a storage sub-circuit; wherein
the data write sub-circuit is connected to one of the first gate lines, one of the data lines and a first node, and the data write sub-circuit is configured to provide the data signal to the first node in response to the first gate drive signal;

the drive sub-circuit is further connected to the light-emitting control circuit and a second node, and the light-emitting element is connected to the second node; and the drive sub-circuit is configured to provide a drive signal to the second node in response to the DC power supply signal and a potential of the first node;

the storage sub-circuit is connected to the first node and the second node, and the storage sub-circuit is configured to adjust a potential of the second node based on the potential of the first node;

the reset circuit is connected to one of the second gate lines, a reset signal terminal and the second node, and the reset circuit is configured to provide the reset signal from the reset signal terminal to the second node in response to the second gate drive signal;

the compensation circuit is connected to one of the third gate lines, a compensation signal terminal and the first node, and the compensation circuit is configured to provide the compensation signal from the compensation signal terminal to the first node in response to the third gate drive signal; and the light-emitting control circuit is connected to one of the light-emitting control signal lines, a DC power supply terminal and the drive sub-circuit, and the light-emitting control circuit is configured to provide the DC power supply signal from the DC power supply terminal to the drive sub-circuit in response to the light-emitting control signal.

In another aspect, a display device is provided. The display device includes a source drive circuit and the display substrate according to the above aspect;

wherein the source drive circuit is connected to a plurality of data lines in the display substrate, and the source drive circuit is configured to provide a data signal to each of the data lines.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
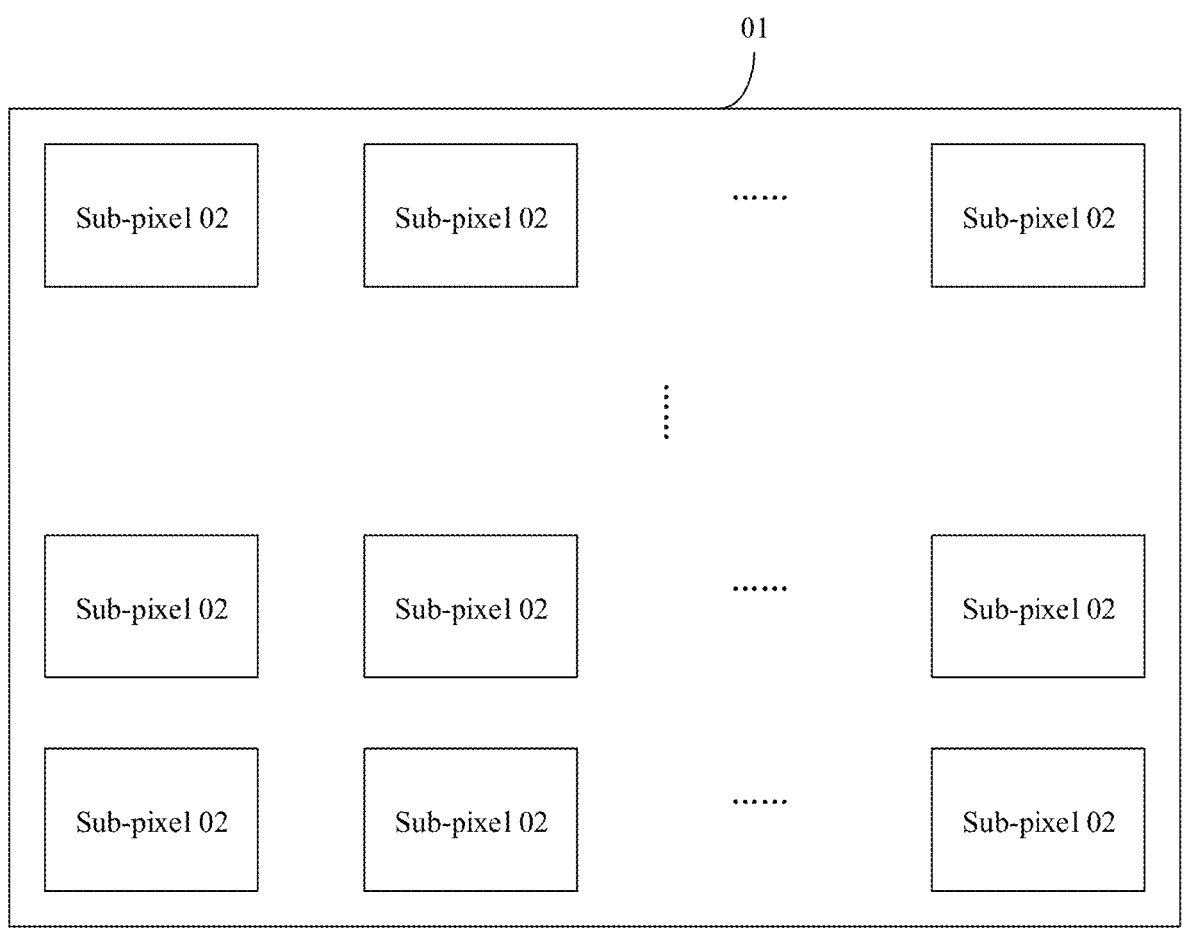
FIG. 1 is a schematic structural diagram of a display substrate according to an embodiment of the present disclosure.

For clearer descriptions of the objectives, technical solutions, and advantages of the inventive concept of embodiments of the present disclosure, the inventive concept to be protected by the embodiments of the present disclosure is described in detail hereinafter with reference to the accompanying drawings and some embodiments.

In the related art, an OLED display substrate includes a plurality of sub-pixels, and each sub-pixel generally includes a light-emitting drive circuit, a reset circuit, and a light-emitting element. Both the light-emitting drive circuit and the reset circuit are connected to the light-emitting element, the light-emitting drive circuit is configured to provide a drive signal to the light-emitting element, and the reset circuit is configured to provide a reset signal to the light-emitting element.

However, in the related art, the sub-pixels occupy a large area, which is not in favor of achieving high resolution.

The transistors used in all embodiments of the present disclosure may be thin film transistors or field effect transistors or other devices with the same properties, and the transistors used in the embodiments of the present disclosure are mainly switching transistors according to their functions in the circuit. Since a source and a drain of the switching transistor used herein are symmetrical, the source and the drain are interchangeable. In the embodiments of the present disclosure, the source is referred to as a first electrode, and the drain is referred to as a second electrode. Alternatively, the drain is referred to as a first electrode, and the source is referred to as a second electrode According to the form in the drawings, an intermediate terminal of the transistor is a gate, a signal input terminal is the source, and a signal output terminal is the drain. In addition, the switching transistor used in the embodiments of the present disclosure may be any one of a P-type switching transistor and an N-type switching transistor. The P-type switching transistor is turned on when the gate is at a low level, and turned off when the gate is at a high level; and the N-type switching transistor is turned on when the gate is at a high level and turned off when the gate is at a low level.

Figure 2:
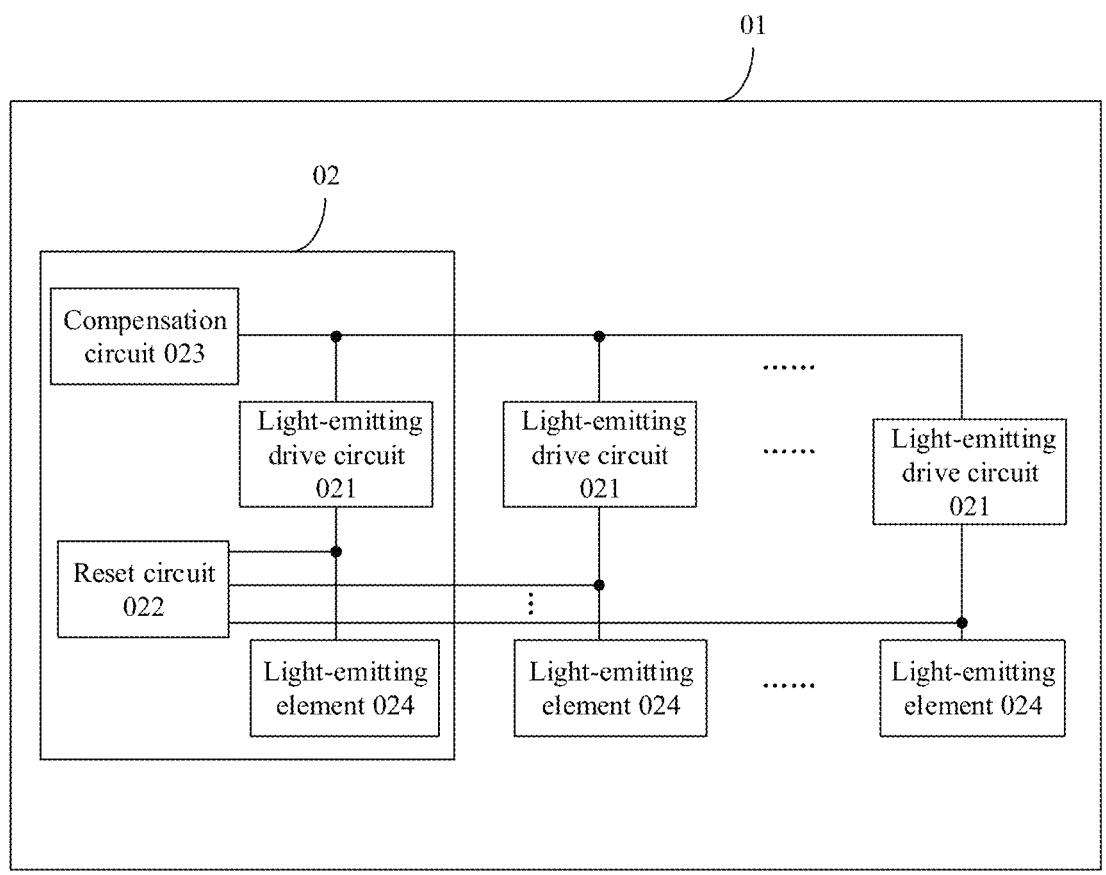
FIG. 2 is a schematic structural diagram of another display substrate according to an embodiment of the present disclosure.

FIG. 1 is a schematic structural diagram of a display substrate according to an embodiment of the present disclosure. As shown in FIG. 1, the display substrate may include a base substrate 01, and a plurality of sub-pixels 02 arranged in an array on the base substrate 01. FIG. 2 is a schematic structural diagram of another display substrate according to an embodiment of the present disclosure. With reference to FIG. 1 and FIG. 2, it may be seen that each sub-pixel 02 may include a light-emitting drive circuit 021, a reset circuit 022, a compensation circuit 023 and a light-emitting element 024.

In each sub-pixel 02, both the light-emitting drive circuit 021 and the reset circuit 022 may be connected to the light-emitting element 024. As shown in FIG. 2, both the light-emitting drive circuit 021 and the reset circuit 022 are connected to the same terminal of the light-emitting element 024. The light-emitting drive circuit 021 may provide a drive signal to the light-emitting element 024, to drive the light-emitting element 024 to emit light. The reset circuit 022 may provide a reset signal to the light-emitting element 024, to realize reset (may also be referred to as noise reduction) of the light-emitting element 024. The compensation circuit 023 may be connected to the light-emitting drive circuit 021 and may provide a compensation signal to the light-emitting drive circuit 021, to enable the light-emitting drive circuit 021 to output the compensated drive signal to the light-emitting element 024 based on the compensation signal, thereby avoiding abnormal light-emitting effect of the light-emitting element 024 due to some reasons (e.g., drift of the threshold voltage of transistors in the light-emitting drive circuit 021), and ensuring the display effect of the sub-pixels 02.

In the embodiments of the present disclosure, at least two sub-pixels 02 may share the same target circuit, and the target circuit may include at least one of the reset circuit 022 and the compensation circuit 023. At least two refers to two or more than two, and at least one of A and B includes three cases, that is, A exists alone, B exists alone, or A and B exist concurrently. For example, at least two sub-pixels 02 may refer to two or more sub-pixels 02. The target circuit being at least one of the reset circuit 022 and the compensation circuit 023 may refer to that the target circuit is the reset circuit 022, the target circuit is the compensation circuit 023, or the target circuit is the reset circuit 022 and the compensation circuit 023. That is, two or more sub-pixels 02 on the base substrate 01 may share one reset circuit 022, or share one compensation circuit 023, or share one reset circuit 022 and one compensation circuit 023. For example, in the display substrate shown in FIG. 2, the plurality of sub-pixels 02 in the same row share the same reset circuit 022 and share the same compensation circuit 023.

It should be noted that, at least two sub-pixels 02 sharing (also referred to as use in common) the same target circuit may refer to that at least two sub-pixels 02 work under the control of the same target circuit. Assuming that three sub-pixels 02 share the same reset circuit 022, the reset circuit 022 may simultaneously provide a reset signal to the light-emitting element 024 in each of the three sub-pixels 02, thereby simultaneously resetting the three light-emitting elements 024 in the three sub-pixels 02.

In summary, the embodiment of the present disclosure provides a display substrate. The display substrate includes a base substrate and a plurality of sub-pixels disposed on the base substrate. Each sub-pixel includes a light-emitting drive circuit, a reset circuit, a compensation circuit and a light-emitting element. Since at least two sub-pixels in the plurality of sub-pixels can share the same reset circuit and/or the same compensation circuit, the number of circuits in the plurality of sub-pixels is reduced, so that the area, occupied by the plurality of sub-pixels, on the base substrate is smaller, which helps achieve a display substrate with high-resolution.

Figure 3:
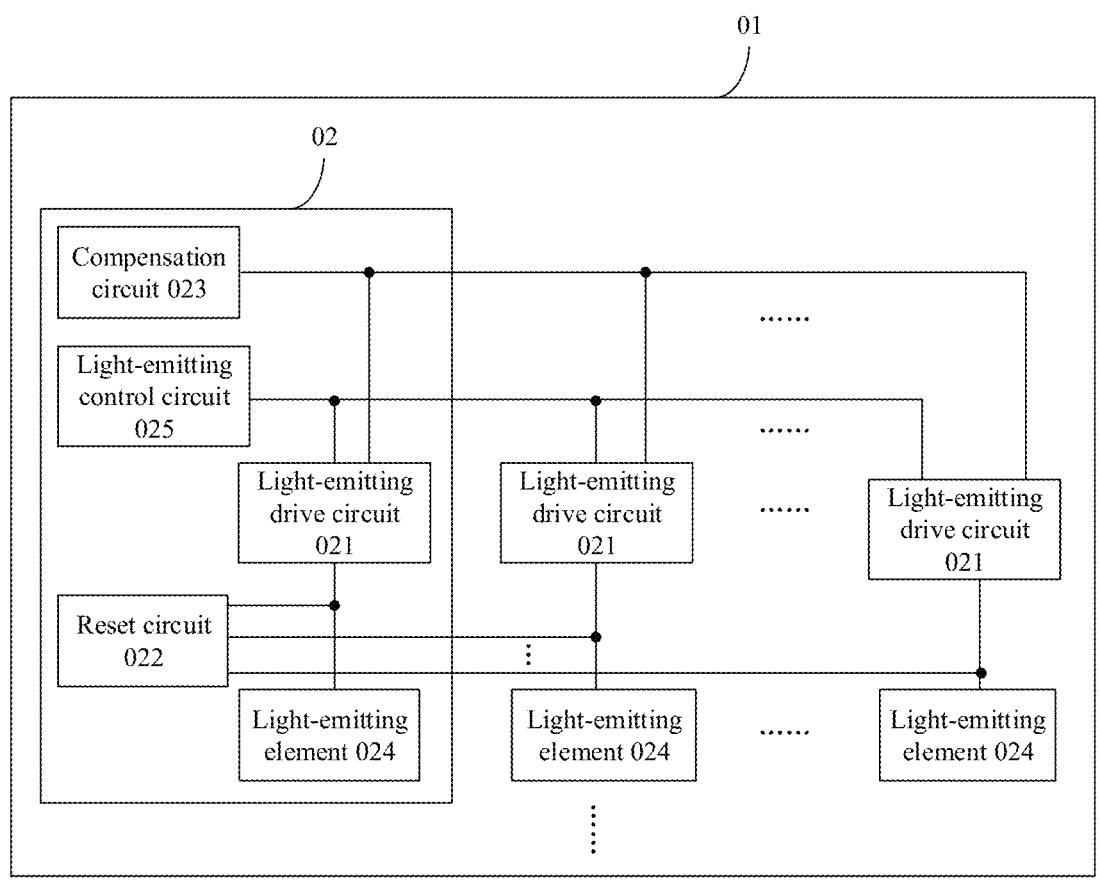
FIG. 3 is a schematic structural diagram of yet another display substrate according to an embodiment of the present disclosure.

In some embodiments, FIG. 3 is a schematic structural diagram of another display substrate according to embodiments of the present disclosure. As shown in FIG. 3, each sub-pixel 02 may further include a light-emitting control circuit 025.

The light-emitting control circuit 025 may be connected to the light-emitting drive circuit 021. The light-emitting control circuit 025 may provide a DC power supply signal to the light-emitting drive circuit 021. Correspondingly, the light-emitting drive circuit 021 may output a drive signal to the light-emitting element 024 in response to the DC power supply signal.

In some embodiments, in the case that the sub-pixel 02 includes a light-emitting control circuit 025, the target circuit in the display substrate according to the embodiments of the present disclosure may include at least one of the reset circuit 022, the compensation circuit 023, and the light-emitting control circuit 025. Similarly, at least one of A, B and C includes seven cases, that is, A exists alone, B exists alone, C exists alone, A and B exist concurrently, A and C exist concurrently, C and B exist concurrently, and A, B and C exist concurrently. The target circuit being at least one of the reset circuit 022, the compensation circuit 023, and the light-emitting control circuit 025 may refer to that: the target circuit is the reset circuit 022; the target circuit is the compensation circuit 023; the target circuit is the light-emitting control circuit 025; the target circuit is the reset circuit 022 and the compensation circuit 023; the target circuit is the reset circuit 022 and the light-emitting control circuit 025; the target circuit is the compensation circuit 023 and the light-emitting control circuit 025; the target circuit is the reset circuit 022, the compensation circuit 023 and the light-emitting control circuit 025. That is, in the case that each sub-pixel 02 further includes the light-emitting control circuit 025, two or more sub-pixels 02 on the base substrate 01 may share one reset circuit 022, or share one compensation circuit 023, or share one light-emitting control circuit 025, or share one reset circuit 022 and one compensation circuit 023, or share one reset circuit 022 and one light-emitting control circuit 025, or share one compensation circuit 023 and one light-emitting control circuit 025, or share one reset circuit 022, one compensation circuit 023 and one light-emitting control circuit 025. Certainly, the more types of the target circuits shared by at least two sub-pixels 02, the less the number of circuits to be arranged on the base substrate, which is more beneficial to achieve high resolution (pixels per inch, PPI). For example, referring to FIG. 3, in the display substrate, the plurality of sub-pixels 02 in the same row share one reset circuit 022, share one compensation circuit 023 and share one light-emitting control circuit 025. That is, the target circuit shared by the plurality of sub-pixels 02 includes the reset circuit 022, the compensation circuit 023 and the light-emitting control circuit 025.

Figure 4:
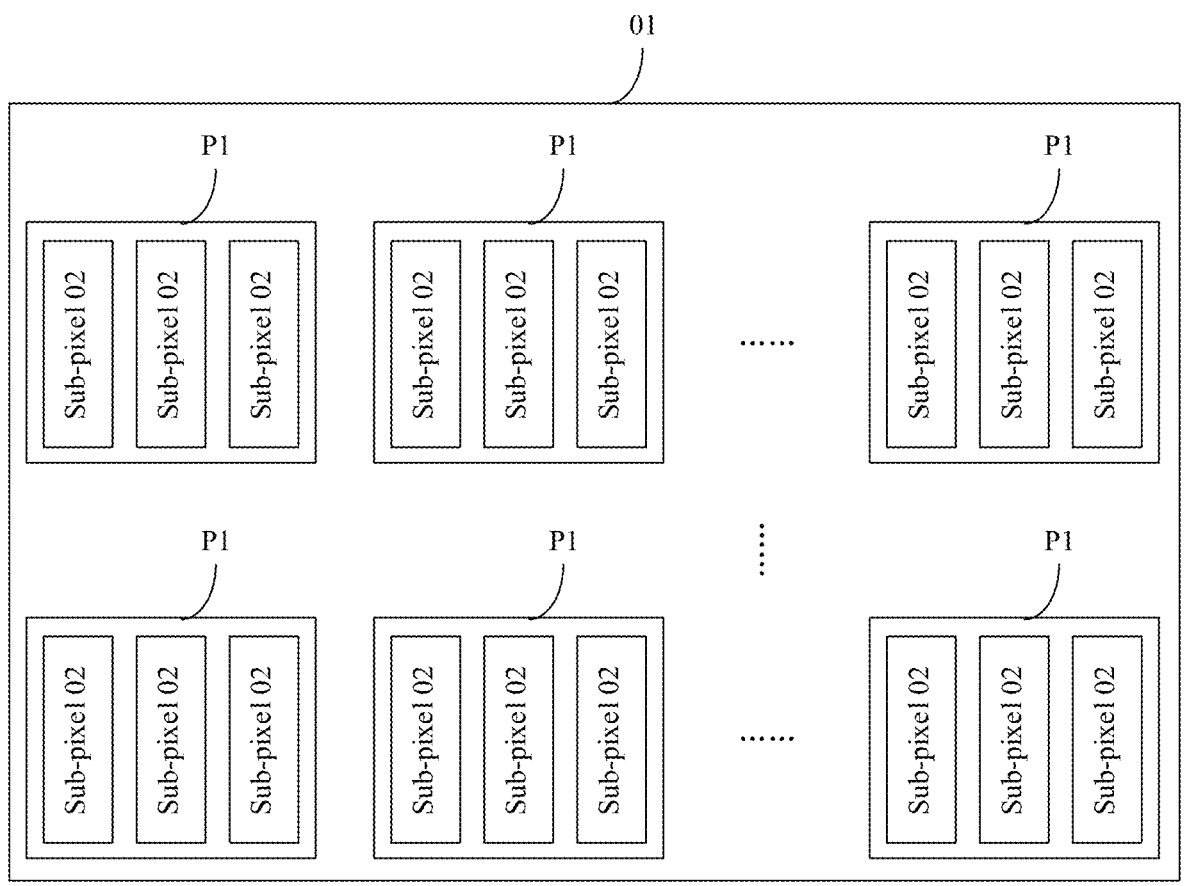
FIG. 4 is a schematic structural diagram of still another display substrate according to an embodiment of the present disclosure.

The reset circuit 022 is configured to provide the reset signal to the light-emitting element 024, the compensation circuit 023 is configured to provide the compensation signal to the light-emitting drive circuit 021, and the light-emitting control circuit 025 is configured to provide a DC power supply signal to the light-emitting drive circuit 021. That is, none of the reset circuit 022, the compensation circuit 023 and the light-emitting control circuit 025 is configured to provide the light-emitting element 024 with a signal for driving the light-emitting element 024 to emit light. Therefore, by sharing the reset circuit 022, the compensation circuit 023 and the light-emitting control circuit 025, not only the normal display of the light-emitting element 024 is not affected, but also the number of required circuits can be reduced, which is beneficial to achieve high PPI In some embodiments, in an embodiment of the present disclosure, FIG. 4 is a schematic structural diagram of still another display substrate according to embodiments of the present disclosure. As shown in FIG. 4, the display substrate may include a plurality of pixels P1, and each pixel P1 may include a plurality of sub-pixels 02. That is, two or more of the plurality of sub-pixels 02 disposed on the base substrate may form one pixel P1.

For example, referring to FIG. 4, in the display substrate, each pixel P1 includes a total of three sub-pixels 02, and the colors displayed by the three sub-pixels 02 in each pixel P1 may be different in order to ensure normal display. For example, in each pixel P1, the color displayed by one sub-pixel 02 may be red: the color displayed by one sub-pixel 02 may be green; the color displayed by one sub-pixel 02 may be blue. That is, the display substrate according to the embodiment of the present disclosure may be a three-primary-color display substrate. Certainly, the number of the sub-pixels 02 in each pixel P1 and the colors displayed by the sub-pixels 02 in each pixel P1 are not limited in the embodiments of the present disclosure. The display substrate is described in the following embodiments by taking an example in which each pixel P1 includes three sub-pixels 02 which display red, green and blue respectively.

Correspondingly, in an optional implementation, the at least two sub-pixels 02 that share the same target circuit in the above embodiments may belong to the same pixel P1. That is, in the embodiments of the present disclosure, in the plurality of sub-pixels 02 in each pixel P1, at least two sub-pixels 02 may share the same target circuit.

Figure 5:
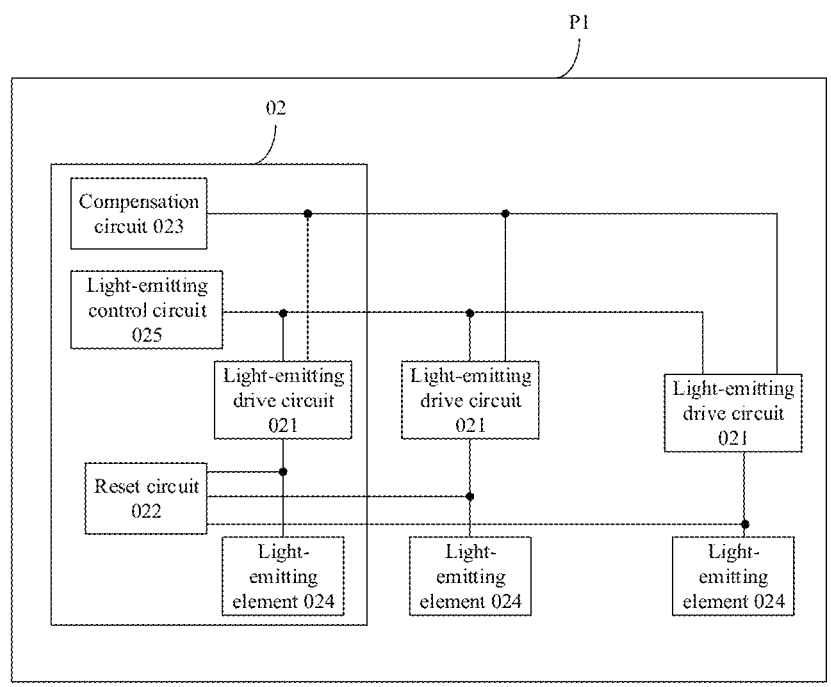
FIG. 5 is a schematic structural diagram of a display substrate by taking one pixel as an example.

For example, each pixel P1 shown in FIG. 4 includes three sub-pixels 02, and each sub-pixel 02 includes a reset circuit 022, a compensation circuit 023, and a light-emitting control circuit 025. FIG. 5 shows a schematic structural diagram of a pixel P1. As shown in FIG. 5, the three sub-pixels 02 in each pixel P1 share the same reset circuit 022, the same compensation circuit 023 and the same light-emitting control circuit 025.

Figure 14:
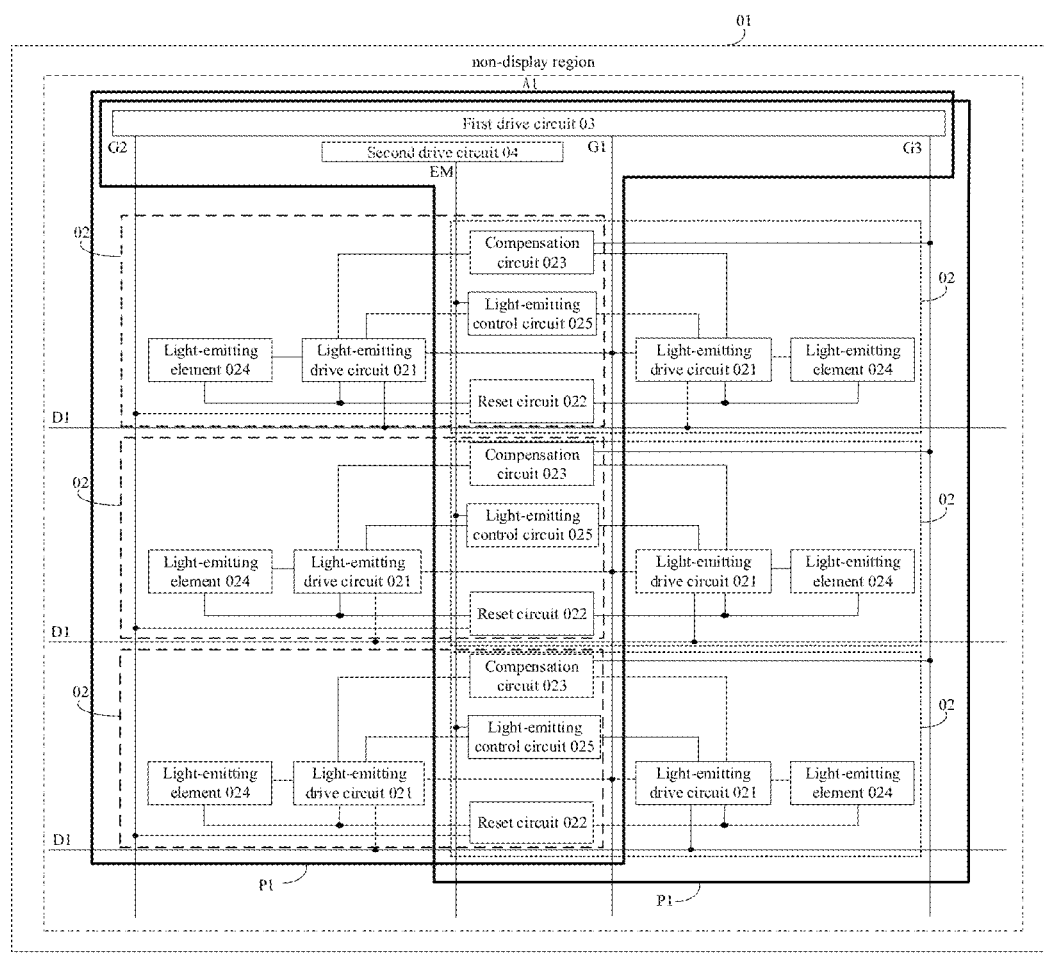
FIG. 14 is a schematic structural diagram of another display substrate by taking two pixel as an example.

Correspondingly, in another optional implementation, as shown in FIG. 14, the at least two sub-pixels 02 that share the same target circuit in the above embodiments may belong to different pixels P1. That is, in the embodiments of the present disclosure, at least two pixels P1 of the plurality of pixels P1 may share the same target circuit.

It should be noted that, for the case where the at least two sub-pixels 02 sharing the same target circuit belong to different pixels P1, it may be that at least one sub-pixel 02 in each pixel P1 and at least one sub-pixel 02 in another pixel P1 share the same target circuit.

In some embodiments, with reference to FIGS. 1 to 5, in the embodiments of the present disclosure, at least two sub-pixels 02 sharing the same target circuit may be disposed in the same row. Alternatively, at least two sub-pixels 02 sharing the same target circuit may be disposed in the same column. That is, the target circuit may be shared by pixels in different rows, or shared by pixels in different columns. By arranging the sub-pixels 02 sharing the target circuit to be in the same row and/or the same column, the layout of the display substrate and the wiring of signal lines can be facilitated.

In the following embodiments, the schematic structural diagram of the display substrate is shown by taking an example in which one pixel P1 includes three sub-pixels 02. As shown in FIG. 6 to FIG. 11, the display substrate may further include a plurality of first gate lines G1, a plurality of second gate lines G2, a plurality of third gate lines G3, a plurality of data lines D1, and a first drive circuit 03. FIGS. 6 to 10 only show the structure of one pixel P1, and correspondingly, only shown one first gate line G1, one second gate line G2, one third gate line G3 and three data lines D1.

Figure 6:
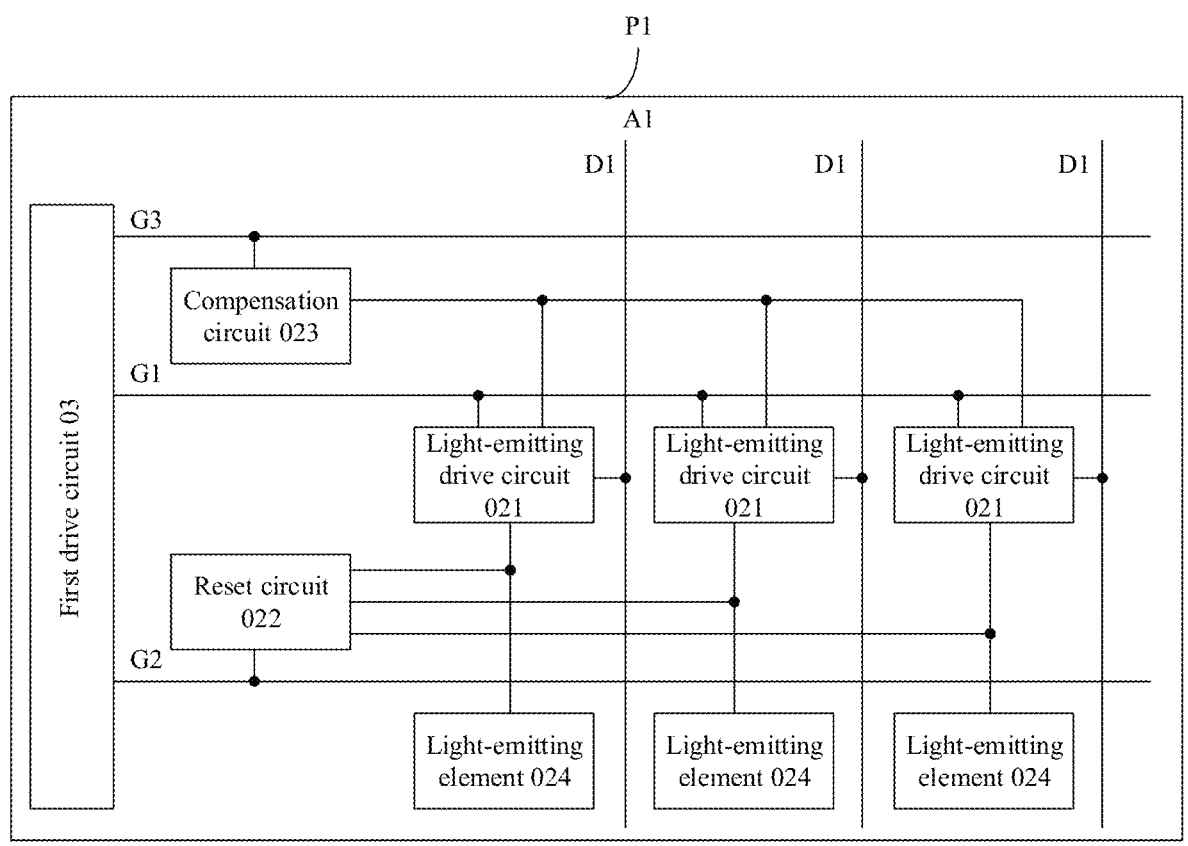
FIG. 6 is a schematic structural diagram of another display substrate by taking one pixel as an example.

Referring to FIG. 6, the first drive circuit 03 may be connected to each first gate line G1, each second gate line G2 and each third gate line G3. The first drive circuit 03 may be configured to provide a first gate drive signal to each first gate line G1, provide a second gate drive signal to each second gate line G2, and provide a third gate drive signal to each third gate line G3. Since the first drive circuit 03 is configured to provide gate drive signals, the first drive circuit 03 may also be referred to as a gate drive circuit.

The light-emitting drive circuit 021 may further be connected to one first gate line G1 and one data line D1. The light-emitting drive circuit 021 may be configured to provide a drive signal to the light-emitting element 024 in response to the first gate drive signal from the first gate line G1 and the data signal from the data line D1.

For example, when the first gate line G1 provides the first gate drive signal, the light-emitting drive circuit 021 may provide a drive signal to the light-emitting element 024 connected thereto in response to the data signal provided by the data line D1, to drive the light-emitting element 024 to emit light.

The reset circuit 022 may further be connected to one second gate line G2. The reset circuit 022 may be configured to provide a reset signal to the light-emitting element 024 in response to the second gate drive signal from the second gate line G2.

For example, the reset circuit 022 may provide a reset signal to the light-emitting element 024 connected thereto in response to the second gate drive signal provided by the second gate line G2, to reset the light-emitting element 024.

The compensation circuit 023 may further be connected to one third gate line G3. The compensation circuit 023 may be configured to provide a compensation signal to the light-emitting drive circuit 021 in response to the third gate drive signal from the third gate line G3.

For example, the compensation circuit 023 may provide a compensation signal to the light-emitting drive circuit 021 connected thereto in response to the third gate drive signal provided by the third gate line G3, to implement the internal compensation of light-emission of the light-emitting element 024 and ensure the display effect of the light-emitting element 024.

By setting the light-emitting drive circuit 021, the reset circuit 022 and the compensation circuit 023 to be connected to different gate lines, the gate drive signal provided by the first drive circuit 03 to each gate line can be flexibly adjusted, so that the three steps of providing the reset signal to the light-emitting element 024, providing the compensation signal to the light-emitting drive circuit 021 and providing the drive signal to the light-emitting element 024 to drive the light-emitting element 024 to emit light do not interfere with each other.

Figure 7:
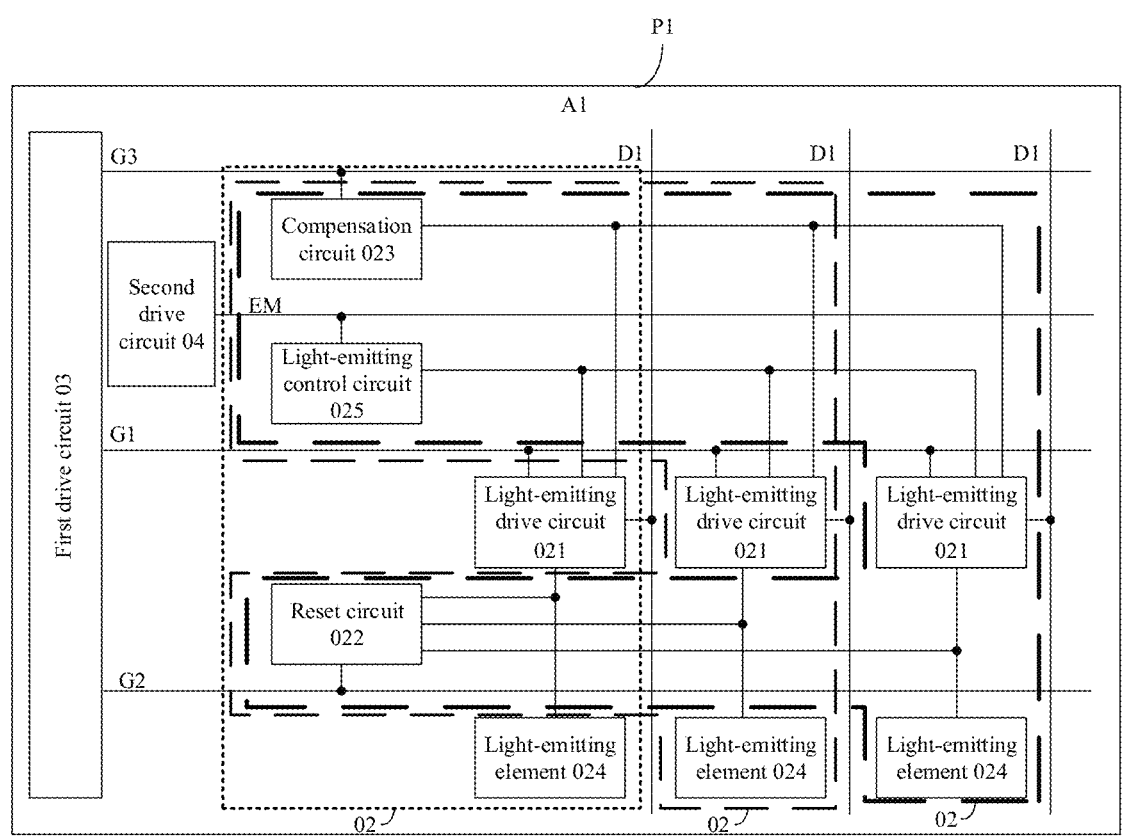
FIG. 7 is a schematic structural diagram of yet another display substrate by taking one pixel as an example.

In some embodiments, as shown in FIG. 5, each sub-pixel 02 further includes a light-emitting control circuit 025. Referring to FIG. 7, the display substrate may further include a plurality of light-emitting control signal lines EM (only one light-emitting control signal line EM is shown in FIG. 7) and a second drive circuit 04.

The second drive circuit 04 may be connected to each light-emitting control signal line EM. The second drive circuit 04 may be configured to provide a light-emitting control signal to each light-emitting control signal line EM.

The light-emitting control circuit 025 may further be connected to one light-emitting control signal line EM. The light-emitting control circuit 025 may be configured to provide a DC power supply signal to the light-emitting drive circuit 021 in response to the light-emitting control signal from the light-emitting control signal line EM.

For example, the light-emitting control circuit 025 may provide a DC power supply signal to the light-emitting drive circuit 021 connected thereto in response to the light-emitting control signal provided by the light-emitting control signal line EM. Correspondingly, the light-emitting drive circuit 021 may output a drive signal to the light-emitting element 024 in response to the data signal and the DC power supply signal.

In some embodiments, with reference to FIGS. 6 to 11, the base substrate 01 according to the embodiments of the present disclosure may be provided with a display region A1 and a non-display region surrounding the display region A1 (both are not shown in the figures). The plurality of sub-pixels 02, the first drive circuit 03 and/or the second drive circuit 04 may all be disposed in the display region A1, which is beneficial to the implementation of a narrow frame. In addition, since the first drive circuit 03 and/or the second drive circuit 04 are disposed in the display region A1, the display substrate according to the embodiments of the present disclosure may be referred to as a display substrate in which the gate drive circuit is disposed in the substrate (gate drive in array, GIA), i.e., GIA display substrate.

In the case where the area of the display region A1 of the base substrate 01 is determined, compared with the related art in which no circuit is shared, in the embodiments of the present disclosure, at least two sub-pixels 02 are configured to share the same target circuit. Thus, in the display region A1 of the base substrate 01, the area of the region other than the region where the sub-pixels 02 are disposed is relatively large, which provides an effective technical support for arranging the first drive circuit 03 and/or the second drive circuit 04 in the display region A1, that is, for the GIA display substrate with high PPI.

Figure 8:
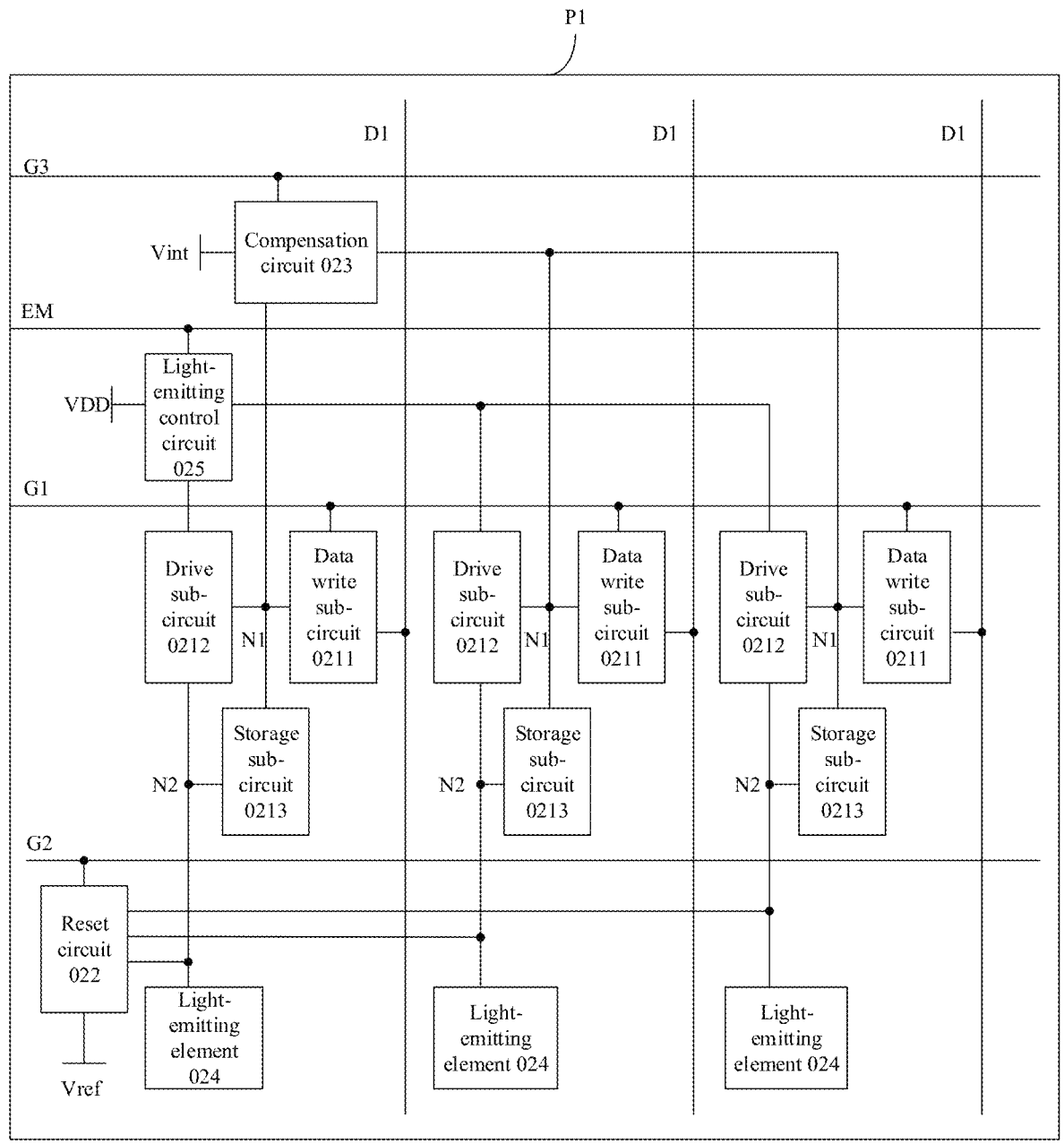
FIG. 8 is a schematic structural diagram of still another display substrate by taking one pixel as an example.

In some embodiments, taking one pixel P1 as an example, referring to FIG. 8, the light-emitting drive circuit 021 in each sub-pixel 02 may include a data write sub-circuit 0211, a drive sub-circuit 0212 and a storage sub-circuit 0213.

The data write sub-circuit 0211 may be connected to one first gate line G1, one data line D1 and a first node N1. The data write sub-circuit 0211 may be configured to provide a data signal to the first node N1 in response to the first gate drive signal.

For example, the data write circuit 0211 may provide the data signal from the data line D1 to the first node N1 in response to the first gate drive signal provided by the first gate line G1 connected thereto.

The drive sub-circuit 0212 may further be connected to the light-emitting control circuit 025 and the second node N2, and the light-emitting element 024 may be connected to the second node N2. The drive sub-circuit 0212 may be configured to provide a drive signal to the second node N2 in response to the DC power supply signal and the potential of the first node N1.

For example, the drive sub-circuit 0212 may provide a drive signal (e.g., drive current) to the second node N2 in response to the data signal at the first node and the DC power supply signal from a DC power supply terminal VDD which is provided by the drive sub-circuit 0212. The drive signal may be provided to the light-emitting element 024 via the second node N2, so that the light-emitting element 024 emits light.

The storage sub-circuit 0213 may be connected to the first node N1 and the second node N2. The storage sub-circuit 0213 may be configured to adjust the potential of the second node N2 based on the potential of the first node N1.

For example, the storage sub-circuit 0213 may adjust the potential of the second node N2 through its coupling action based on the potential of the first node N1.

The reset circuit 022 may be connected to one second gate line G2, a reset signal terminal Vref, and the second node N2. The reset circuit 022 may be configured to provide a reset signal from the reset signal terminal Vref to the second node N2 in response to a second gate drive signal.

For example, the reset circuit 022 may provide the reset signal from the reset signal terminal Vref to the second node N2 in response to the second gate drive signal provided by the second gate line G2 connected thereto, to reset the second node N2, that is, reset the light-emitting element 024.

The compensation circuit 023 may be connected to one third gate line G3, a compensation signal terminal Vint and the first node N1. The compensation circuit 023 may be configured to provide a compensation signal from the compensation signal terminal Vint to the first node N1 in response to a third gate drive signal.

For example, the compensation circuit 023 may provide the compensation signal from the compensation signal terminal Vint to the first node N1 in response to the third gate drive signal provided by the third gate line G3 connected thereto.

The light-emitting control circuit 025 may be connected to one light-emitting control signal line EM, the DC power supply terminal VDD and the drive sub-circuit 0212. The light-emitting control circuit 025 may be configured to provide the DC power supply signal from the DC power supply terminal VDD to the drive sub-circuit 0212 in response to the light-emitting control signal.

For example, the light-emitting control circuit 025 may provide the DC power supply signal from the DC power supply terminal VDD to the drive sub-circuit 0212 in response to the light-emitting control signal provided by the light-emitting control signal line EM connected thereto.

Figure 9:
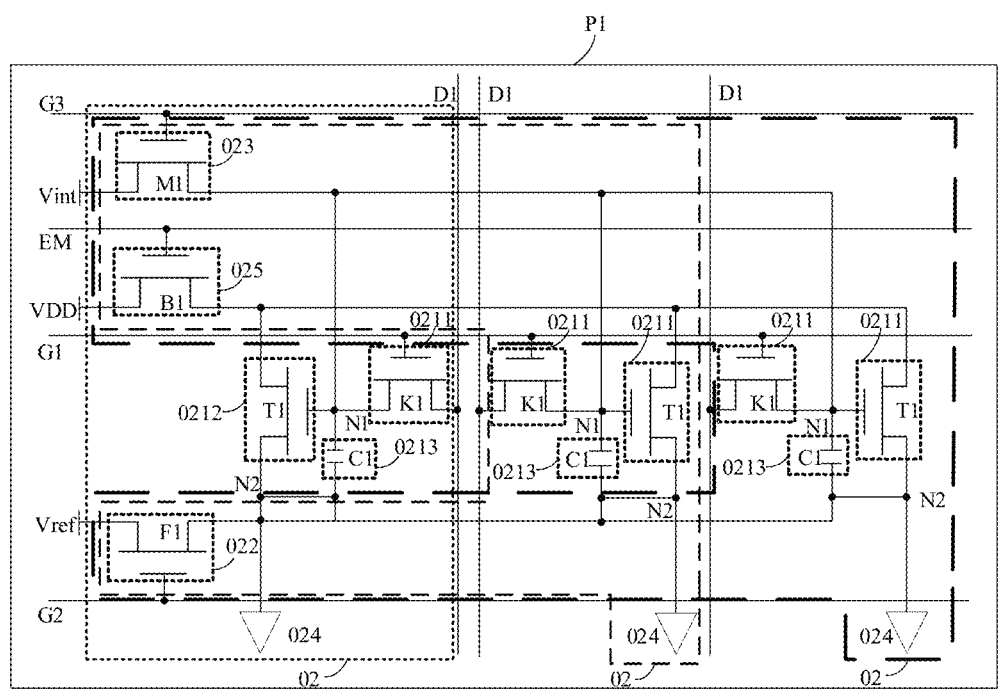
FIG. 9 is a schematic structural diagram of still another display substrate by taking one pixel as an example.
Figure 10:
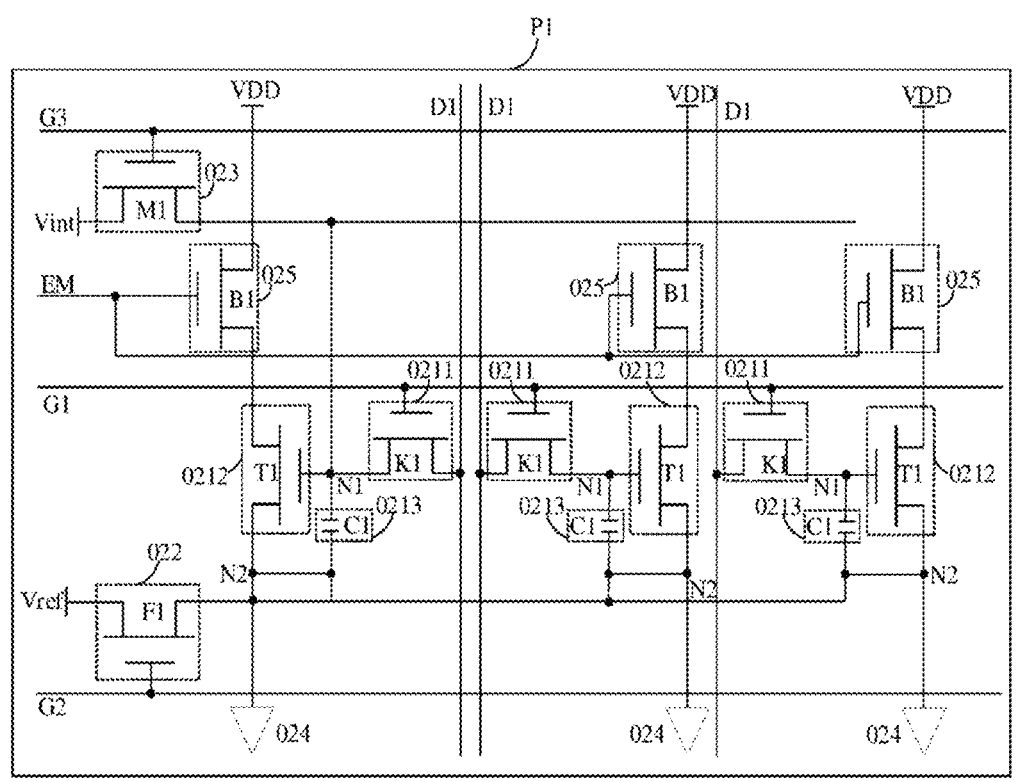
FIG. 10 is a schematic structural diagram of still another display substrate by taking one pixel as an example.
Figure 11:
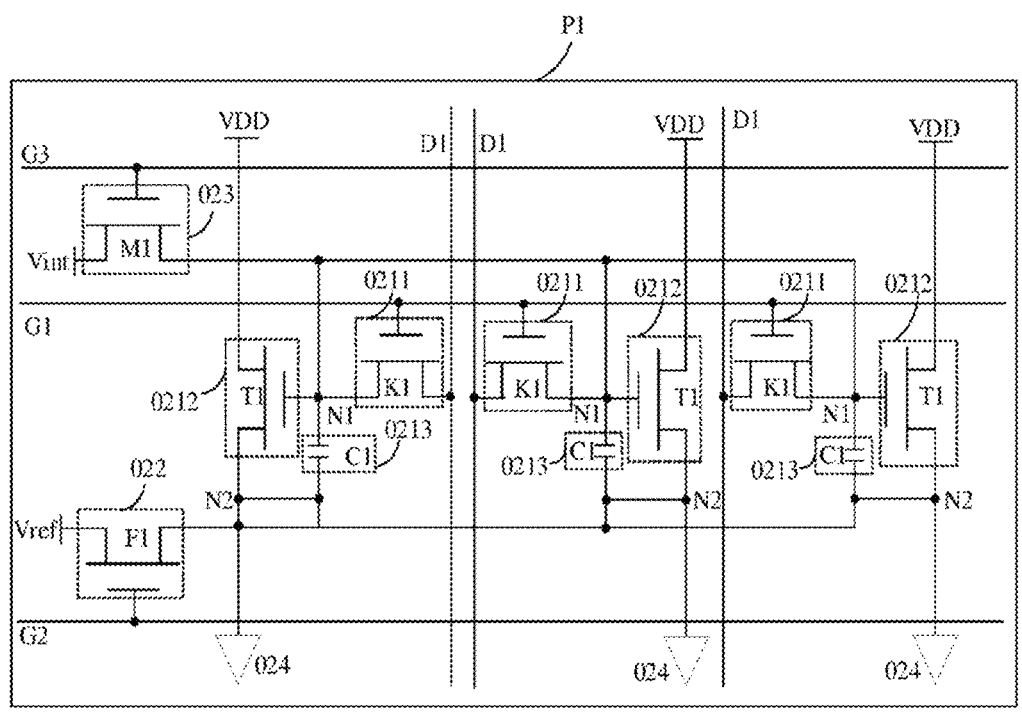
FIG. 11 is a schematic structural diagram of still another display substrate by taking one pixel as an example.

In some embodiments, with continuing reference to FIGS. 9 to 11, the data write sub-circuit 0211 may include a data write transistor K1, the drive sub-circuit 0212 may include a drive transistor T1, and the storage sub-circuit 0213 may include a storage capacitor C1. The reset circuit 022 may include a reset transistor F1. The compensation circuit 023 may include a compensation transistor M1. For the sub-pixel 02 further including the light-emitting control circuit 025, referring to FIG. 9 and FIG. 10, the light-emitting control circuit 025 may include a light-emitting transistor B1.

A gate of the data write transistor K1 may be connected to one first gate line G1, a first electrode of the data write transistor K1 may be connected to one data line D1, and a second electrode of the data write transistor K1 may be connected to the first node N1.

A first electrode of the drive transistor T1 may be connected to a second electrode of the light-emitting transistor B1, and a second electrode of the drive transistor T1 may be connected to the second node N2.

One end of the storage capacitor C1 may be connected to the second node N2, and the other end of the storage capacitor C1 may be connected to the first node N1.

A gate of the reset transistor F1 may be connected to one second gate line G2, a first electrode of the reset transistor F1 may be connected to the reset signal terminal Vref, and a second electrode of the reset transistor F1 may be connected to the second node N2.

A gate of the compensation transistor M1 may be connected to one third gate line G3, a first electrode of the compensation transistor M1 may be connected to the compensation signal terminal Vint, and a second electrode of the compensation transistor M1 may be connected to the first node N1.

A gate of the light-emitting transistor B1 may be connected to the light-emitting control signal line EM, a first electrode of the light-emitting transistor B1 may be connected to the DC power supply terminal VDD, and the second electrode of the light-emitting transistor B1 may be connected to the first electrode of the drive transistor T1.

It should be noted that, in the pixel P1 shown in FIG. 9 and FIG. 10, each sub-pixel 02 includes a light-emitting transistor B1. FIG. 9 illustrates share of target circuit by taking an example in which the three sub-pixels 02 in the pixel P1 share the same reset circuit 022, the same compensation circuit 023 and the same light-emitting control circuit 025, and FIG. 10 illustrates share of the target circuit by taking an example in which the three sub-pixels 02 in the pixel P1 only share the same reset circuit 022 and the same compensation circuit 023 but not share the same light-emitting control circuit 025. In the pixel P1 shown in FIG. 11, each sub-pixel 01 does not include a light-emitting transistor B1, and FIG. 11 illustrates share of the target circuit by taking an example in which the three sub-pixels 02 in the pixel P1 share the same reset circuit 022 and the same compensation circuit 023.

If the pixel structure in the related art is the same as the pixel structure in the embodiments of the present disclosure, for the display substrate shown in FIG. 9, a total of six transistors (including two reset transistors F1, two compensation transistors M1 and two light-emitting transistors B1) can be saved for one pixel P1, compared with one pixel P1 in the prior art, which is more readily compatible with the GIA display substrate with high PPI. For the display substrate shown in FIGS. 10 and 11, a total of four transistors (including two reset transistors F1 and two compensation transistors M1) can be saved for one pixel P1, compared with one pixel P1 in the prior art. Moreover, by sharing the target circuit, the number of transistors connected to one signal line (e.g., the first gate line G1, the second gate line G2, the third gate line G3 and the light-emitting control signal line EM) which is connected to the target circuit can be reduced. Compared with the related art, the load on the signal line connected to the target circuit can be reduced, and the width-to-length ratio of the output transistor in the drive circuit (e.g., the first drive circuit 03 and the second drive circuit 04) connected to the signal line can be reduced accordingly, to ensure the display effect.

It should be noted that, providing a signal described in the embodiments of the present disclosure may refer to providing a signal with an active potential, and providing no signal may refer to providing a signal with an inactive potential. Also, providing a signal can be understood as inputting a signal or outputting a signal. For an N-type transistor, the active potential may be a high potential relative to the inactive potential, and for a P-type transistor, the active potential may be a low potential relative to the inactive potential.

For example, taking the display substrate shown in FIG. 8 and FIG. 9 as an example, when the light-emitting element 024 in each sub-pixel 02 is driven to emit light, the first drive circuit 03 may sequentially provide the first gate drive signal to each of the first gate lines G1 connected thereto, sequentially provide the second gate drive signal to each of the second gate lines G2 connected thereto, and sequentially provide the third gate drive signal to each of the third gate lines G3 connected thereto.

Figure 12:
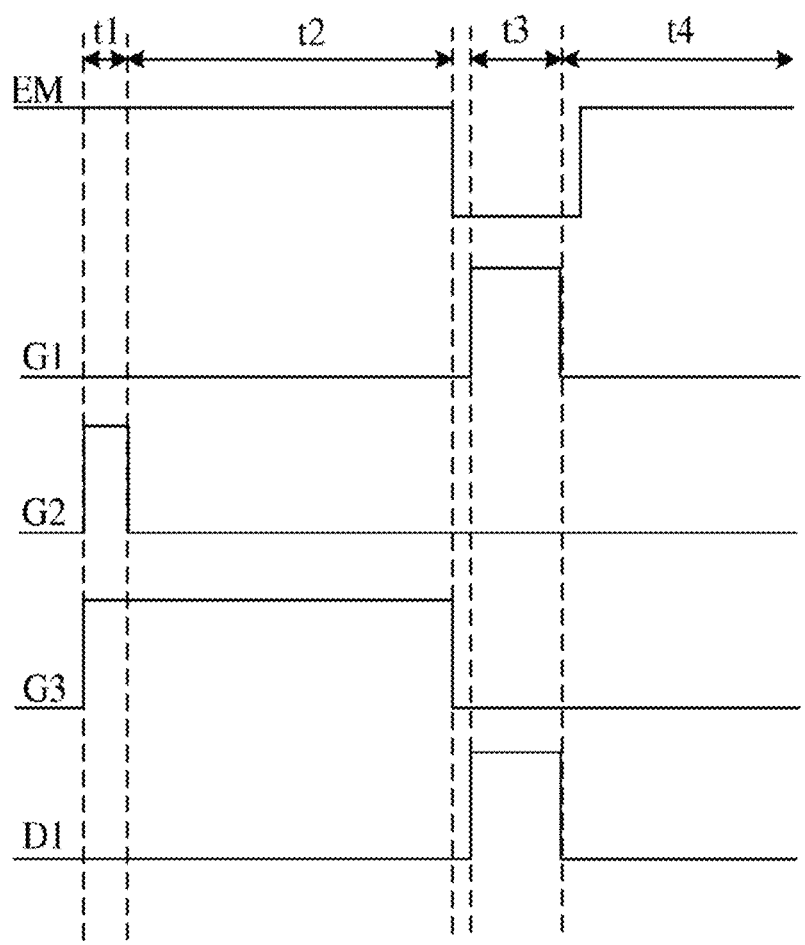
FIG. 12 is a work timing diagram of a sub-pixel according to embodiments of the present disclosure.

FIG. 12 shows a work timing diagram of a pixel. As shown in FIG. 12, the light-emitting process of each light-emitting element 024 may include four stages: a reset stage t1, a compensation stage t2, a data write stage t3 and a light-emitting stage t4. Referring to FIG. 12, in the reset stage t1, the first drive circuit 03 may first provide the second gate drive signal to the second gate line G2 connected to the pixel P1, and provide the third gate drive signal to the third gate line G3 connected to the pixel P1. The second drive circuit 04 may provide the light-emitting control signal to the light-emitting control signal line EM connected to the pixel P1. That is, the first drive circuit 03 provides the gate drive signals at the active potential to the second gate line G2 and the third gate line G3 which are connected to the pixel P1, and the second drive circuit 04 provides the light-emitting control signal at the active potential to the light-emitting control signal line EM connected to the pixel P1. In this case, the reset transistor F1 connected to the second gate line G2, the compensation transistor M1 connected to the third gate line G3, and the light-emitting transistor B1 connected to the light-emitting control signal line EM are all turned on. Thus, the reset signal terminal Vref provides a reset signal at the inactive potential to the second node N2 connected to the reset transistor F1 through the reset transistor F1, so as to reset the second node N2. The compensation signal terminal Vint provides a compensation signal to the first node N1 connected to the compensation transistor M1 through the compensation transistor M1, and the potential of the compensation signal can cause the drive transistor T1 to be pre-turned on. At the same time, the DC power supply terminal VDD provides the DC power supply signal to the first electrode of the drive transistor T1 through the light-emitting transistor B1.

In the reset stage t1, the first drive circuit 03 does not provide the first gate drive signal to the first gate line G1 connected to the pixel P1, that is, the first drive circuit 03 provides a gate drive signal at the inactive potential to the first gate line G1 connected to the pixel P1, and the data write transistor K1 connected to the first gate line G1 is turned off.

In the compensation stage t2, the potential of the second gate drive signal provided by the first drive circuit 03 to the second gate line G2 connected to the pixel P1 jumps from an active potential to an inactive potential, and the reset transistor FJ is turned off. Moreover, the potential of the third gate drive signal provided by the first drive circuit 03 to the third gate line G3 connected to the pixel P1 and the potential of the light-emitting control signal provided by the second drive circuit 04 to the light-emitting control signal line EM connected to the pixel P1 maintain at active potentials, and the compensation transistor M1 and the light-emitting transistor B1 keep being turned-on. The DC power supply terminal VDD continues to provide a DC power supply signal to the first electrode of the drive transistor T1 through the light-emitting transistor B1. Under the coupling action of the storage capacitor C1, the potential of the second node N2 changes with the potential of the compensation signal written to the first node N1 until it changes to Vg (the potential of the first node N1)-Vs (the potential of the second node N2)=Vth (threshold voltage of the drive transistor T1). This process may also be referred to as a process of charging the second node N2 of each sub-pixel through the drive transistor T1 of each sub-pixel respectively.

In addition, in the compensation stage t2, the first drive circuit 03 still provides the first gate drive signal at the inactive potential to the first gate line G1 connected to the pixel P1, and the data write transistor K1 connected to the first gate line G1 still keeps being turned-off.

In the data write stage t3, the potential of the second gate drive signal provided by the first drive circuit 03 to the second gate line G2 connected to the pixel P1 maintains at the inactive potential, and the reset transistor F1 is turned off. In addition, both the potential of the third gate drive signal provided by the first drive circuit 03 to the third gate line G3 connected to the pixel P1 and the potential of the light-emitting control signal provided by the second drive circuit 04 to the light-emitting control signal line EM connected to the pixel P1 jump from the active potential to the inactive potential. The light-emitting transistor B1 and the compensation transistor M1 are turned off. The potential of the first gate drive signal provided by the first drive circuit 03 to the first gate line G1 connected to the pixel P1 jumps from the inactive potential to the active potential, the data write transistor K1 is turned on. The data line D1 provides a data signal (which may also be referred to as gray-scale data) to the first node N1 through the data write transistor K1.

In the light-emitting stage t4, both the potential of the second gate drive signal provided by the first drive circuit 03 to the second gate line G2 connected to the pixel P1 and the potential of the third gate drive signal provided by the first drive circuit 03 to the third gate line G3 connected to the pixel P1 maintain at the inactive potential, and the reset transistor F1 and the compensation transistor M1 are turned off. The potential of the first gate drive signal provided by the first drive circuit 03 to the first gate line G1 connected to the pixel P1 jumps from the active potential to the inactive potential, and the data write transistor K1 is turned off. The potential of the light-emitting control signal provided by the second drive circuit 04 to the light-emitting control signal line EM connected to the pixel P1 jumps from the inactive potential to the active potential, the light-emitting transistor B1 is turned on. The drive transistor T1 outputs a drive signal to the second node N2 in response to the DC power supply signal provided by the light-emitting transistor B1 and the potential of the first node N1 at the moment, and the light-emitting element 024 emits light in response to the drive signal.

It should also be noted that the above embodiments are described by taking the transistors being N-type transistors as an example. Certainly, the transistors may be P-type transistors. For an N-type transistor, the active potential is a high potential relative to the inactive potential; and for a P-type transistor, the active potential is low potential relative to the inactive potential.

In summary, the embodiment of the present disclosure provides a display substrate. The display substrate includes a base substrate and a plurality of sub-pixels disposed on the base substrate, and each of the sub-pixels includes a light-emitting drive circuit, a reset circuit, a compensation circuit and a light-emitting element. Since at least two sub-pixels in the plurality of sub-pixels can share the same reset circuit and/or the same compensation circuit, the number of circuits in the plurality of sub-pixels is reduced, so that the area, occupied by the plurality of sub-pixels, on the base substrate is smaller, which helps achieve a display substrate with high-resolution.

Figure 13:
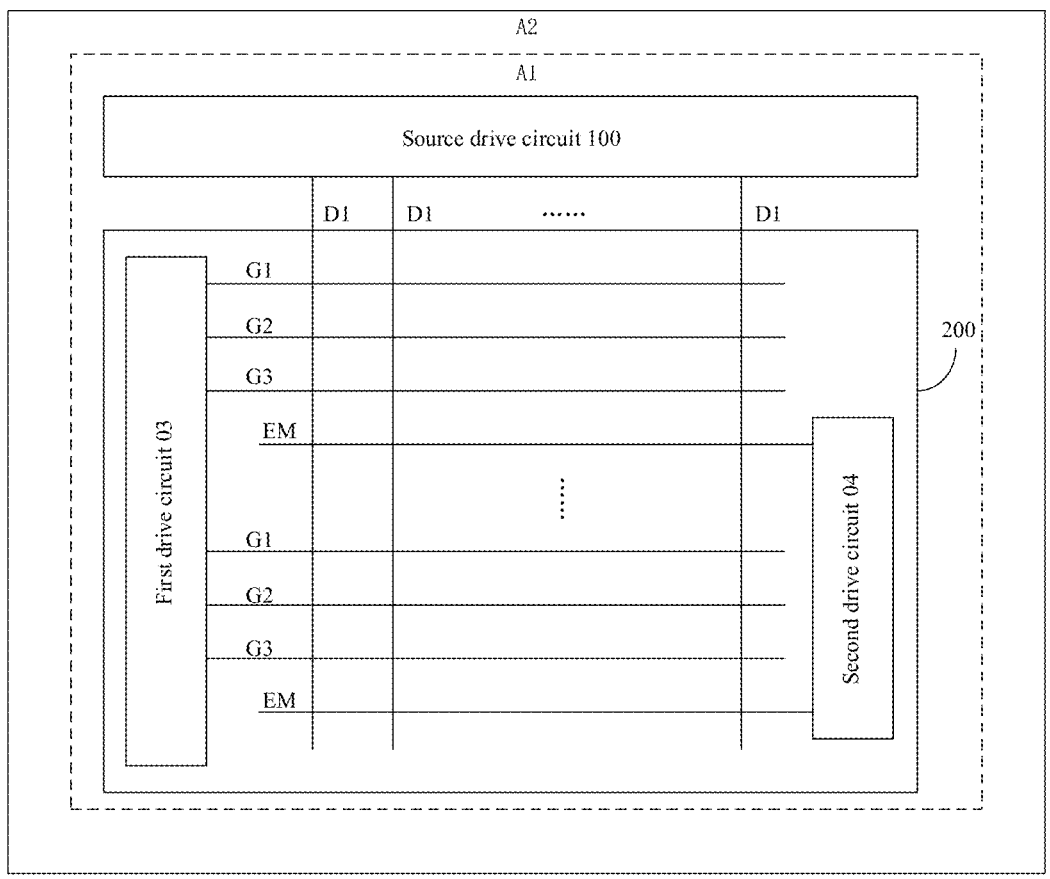
FIG. 13 is a schematic structural diagram of a display device according to embodiments of the present disclosure.

FIG. 13 is a schematic structural diagram of a display device according to embodiments of the present disclosure. As shown in FIG. 13, the display device may include a source drive circuit 100 and a display substrate 200 as shown in any one of FIGS. 1 to 11. The source drive circuit 100 may be connected to the plurality of data lines D1 in the display substrate 200, and the source drive circuit 100 may be configured to provide a data signal to each of the data lines D1.

In addition, FIG. 13 further shows the first drive circuit 03, the second drive circuit 04, a plurality of first gate lines G1, a plurality of second gate lines G2, a plurality of third gate lines G3, and a plurality of light-emitting control signal lines EM in the display substrate 200. The first drive circuit 03 may be connected to the plurality of first gate lines G1, the plurality of second gate lines G2 and the plurality of third gate lines G3, to provide the gate drive signals to the gate lines. The second drive circuit 04 may be connected to the plurality of light-emitting control signal lines EM, to provide the light-emitting control drive signals to the light-emitting control signal lines EM.

In some embodiments, the display device may be an OLED display device, an electronic paper, a mobile phone, a tablet computer, a TV, a display, a notebook computer, a digital photo frame, and any products or components with a display function.

It should be understood that "a plurality of" referred herein refers to two or more. The term "and/or" describes an association relationship of the associated objects, indicating three kinds of relationships. For example, A and/or B may be expressed as: A exists alone, A and B exist concurrently, and B exists alone.

Those skilled in the art may clearly understand that, for the convenience and brevity of descriptions, for the specific working processes of the display substrate and various circuits described above, reference may be made to the corresponding processes in the foregoing method embodiments, and details are not repeated here.

The descriptions above are merely optional embodiments of the present disclosure, and are not intended to limit the present disclosure. Any modifications, equivalent substitutions, improvements and the like made within the spirit and principle of the present disclosure should be included in the protection scope of the present disclosure.

What is claimed is:

1. A display substrate, comprising:
   a base substrate;
   a plurality of sub-pixels arranged in an array on the base substrate, each of the sub-pixels comprising a light-emitting drive circuit, a reset circuit, a compensation circuit, a light-emitting control circuit and a light-emitting element; wherein the light-emitting drive circuit and the reset circuit are connected to the light-emitting element, the light-emitting drive circuit is configured to provide a drive signal to the light-emitting element, and the reset circuit is configured to provide a reset signal to the light-emitting element; the compensation circuit is connected to the light-emitting drive circuit, and the compensation circuit is configured to provide a compensation signal to the light-emitting drive circuit; the light-emitting control circuit is connected to the light-emitting drive circuit, and configured to provide a DC power supply signal to the light-emitting drive circuit;
   wherein at least two of the sub-pixels share a same target circuit, and the target circuit comprises the reset circuit, the compensation circuit and the light-emitting control circuit;
   the light-emitting control circuit in each of the sub-pixels comprises a light-emitting transistor, a gate of the light-emitting transistor is connected to a light-emitting control signal line, a first electrode of the light-emitting transistor is connected to a DC power supply terminal, and a second electrode of the light-emitting transistor is connected to the light-emitting drive circuits of the at least two of the sub-pixels which share the light-emitting control circuit, the light-emitting control circuit is configured to provide a DC power supply signal from the DC power supply terminal to the light-emitting drive circuits of the at least two of the sub-pixels in response to a light-emitting control signal from the light-emitting control signal line;

the light-emitting drive circuit in each of the sub-pixels comprises a data write sub-circuit, the data write sub-circuit is connected to one of a plurality of first gate lines, one of a plurality of data lines and a first node, and the data write sub-circuit is configured to provide a data signal from the data line to the first node in response to a first gate drive signal from the first gate line;

the reset circuit is connected to one of a plurality of second gate lines, a reset signal terminal and a second node, and the reset circuit is configured to provide a reset signal from the reset signal terminal to the second node in response to the second gate drive signal from the second gate line; and the compensation circuit is connected to one of a plurality of third gate lines, a compensation signal terminal and the first node, and the compensation circuit is configured to provide a compensation signal from the compensation signal terminal to the first node in response to a third gate drive signal from the third gate line.

2. The display substrate according to claim 1, comprising a plurality of pixels, wherein
each of the pixels comprises a plurality of sub-pixels; and
the at least two of the sub-pixels sharing the same target circuit belong to the same pixel.

3. The display substrate according to claim 2, wherein the plurality of sub-pixels in each of the pixels share the same target circuit.

4. The display substrate according to claim 1, comprising a plurality of pixels, wherein
each of the pixels comprises a plurality of sub-pixels; and
the at least two of the sub-pixels sharing the same target circuit belong to different pixels.

5. The display substrate according to claim 1, wherein the at least two of the sub-pixels sharing the same target circuit are disposed in a same row.

6. The display substrate according to claim 1, wherein the at least two of the sub-pixels sharing the same target circuit are disposed in a same column.

7. The display substrate according to claim 1, further comprising: the plurality of first gate lines, the plurality of second gate lines, the plurality of third gate lines, the plurality of data lines, and a first drive circuit; wherein
the first drive circuit is connected to each of the first gate lines, each of the second gate lines and each of the third gate lines, and the first drive circuit is configured to provide the first gate drive signal to each of the first gate lines, provide the second gate drive signal to each of the second gate lines, and provide the third gate drive signal to each of the third gate lines; and
the light-emitting drive circuit is further connected to one of the first gate lines and one of the data lines, and the light-emitting drive circuit is configured to provide the drive signal to the light-emitting element in response to the first gate drive signal from the first gate line and a data signal from the data line.

8. The display substrate according to claim 7, wherein the base substrate is provided with a display region and a non-display region surrounding the display region;
the display substrate comprises a plurality of pixels, wherein each of the plurality of pixels comprises the plurality of sub-pixels and the first drive circuit, and the plurality of sub-pixels and the first drive circuit are disposed in the display region.

9. The display substrate according to claim 7, wherein the display substrate further comprises a plurality of the light-emitting control signal lines and a second drive circuit; wherein
the second drive circuit is connected to each of the light-emitting control signal lines, and the second drive circuit is configured to provide a light-emitting control signal to each of the light-emitting control signal lines.

10. The display substrate according to claim 9, wherein the base substrate is provided with a display region and a non-display region surrounding the display region;
wherein the plurality of sub-pixels and the second drive circuit are disposed in the display region.

11. The display substrate according to claim 9, wherein the light-emitting drive circuit in each of the sub-pixels comprises a drive sub-circuit and a storage sub-circuit; wherein
the drive sub-circuit is further connected to the light-emitting control circuit and a second node, and the light-emitting element is connected to the second node; and the drive sub-circuit is configured to provide a drive signal to the second node in response to the DC power supply signal and a potential of the first node;
the storage sub-circuit is connected to the first node and the second node, and the storage sub-circuit is configured to adjust a potential of the second node based on the potential of the first node; and
the light-emitting control circuit is connected to one of the light-emitting control signal lines, a DC power supply terminal and the drive sub-circuit, and the light-emitting control circuit is configured to provide the DC power supply signal from the DC power supply terminal to the drive sub-circuit in response to the light-emitting control signal.

12. The display substrate according to claim 11, wherein the at least two of the sub-pixels that share the same target circuit are disposed in a same row; or, the at least two of the sub-pixels that share the same target circuit are disposed in a same column.

13. A display device, comprising a source drive circuit and a display substrate, wherein the display substrate comprises:
a base substrate; and
a plurality of sub-pixels arranged in an array on the base substrate, each of the sub-pixels comprising a light-emitting drive circuit, a reset circuit, a compensation circuit, a light-emitting control circuit and a light-emitting element; wherein the light-emitting drive circuit and the reset circuit are connected to the light-emitting element, the light-emitting drive circuit is configured to provide a drive signal to the light-emitting element, and the reset circuit is configured to provide a reset signal to the light-emitting element; the compensation circuit is connected to the light-emitting drive circuit, and the compensation circuit is configured to provide a compensation signal to the light-emitting drive circuit; the light-emitting control circuit is connected to the light-emitting drive circuit, and configured to provide a DC power supply signal to the light-emitting drive circuit;

wherein at least two of the sub-pixels share a same target circuit, and the target circuit comprises the reset circuit, the compensation circuit and the light-emitting control circuit; and wherein the source drive circuit is connected to a plurality of data lines in the display substrate, and the source drive circuit is configured to provide a data signal to each of the data lines;

the light-emitting control circuit in each of the sub-pixels comprises a light-emitting transistor, a gate of the light-emitting transistor is connected to a light-emitting control signal line, a first electrode of the light-emitting transistor is connected to a DC power supply terminal, and a second electrode of the light-emitting transistor is connected to the light-emitting drive circuits of the at least two of the sub-pixels which share the light-emitting control circuit, the light-emitting control circuit is configured to provide a DC power supply signal from the DC power supply terminal to the light-emitting drive circuits of the at least two of the sub-pixels in response to a light-emitting control signal from the light-emitting control signal line;

the light-emitting drive circuit in each of the sub-pixels comprises a data write sub-circuit, the data write sub-circuit is connected to one of a plurality of first gate lines, one of a plurality of data lines and a first node, and the data write sub-circuit is configured to provide a data signal from the data line to the first node in response to a first gate drive signal from the first gate line;

the reset circuit is connected to one of a plurality of second gate lines, a reset signal terminal and a second node, and the reset circuit is configured to provide a reset signal from the reset signal terminal to the second node in response to the second gate drive signal from the second gate line; and the compensation circuit is connected to one of a plurality of third gate lines, a compensation signal terminal and the first node, and the compensation circuit is configured to provide a compensation signal from the compensation signal terminal to the first node in response to a third gate drive signal from the third gate line.

14. The display device according to claim 13, wherein the display substrate comprises a plurality of pixels, wherein
each of the pixels comprises a plurality of sub-pixels; and
the at least two of the sub-pixels sharing the same target circuit belong to the same pixel.

15. The display device according to claim 14, wherein the plurality of sub-pixels in each of the pixels share the same target circuit.

16. The display device according to claim 13, wherein the display substrate comprises a plurality of pixels, wherein
each of the pixels comprises a plurality of sub-pixels; and
the at least two of the sub-pixels sharing the same target circuit belong to different pixels.

17. The display device according to claim 13, wherein the at least two of the sub-pixels sharing the same target circuit are disposed in a same row.

18. The display device according to claim 13, wherein the at least two of the sub-pixels sharing the same target circuit are disposed in a same column.

* * * * *